(12) United States Patent
Chen et al.

(10) Patent No.: US 6,479,317 B2
(45) Date of Patent: Nov. 12, 2002

(54) METHOD FOR INTEGRATING ANTI-REFLECTION LAYER AND SALICIDE BLOCK

(75) Inventors: Chong-Yao Chen, Chang-Hua (TW); Chen-Bin Lin, Taipei (TW); Feng-Ming Liu, Feng-Shan (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/975,618

(22) Filed: Oct. 11, 2001

(65) Prior Publication Data

US 2002/0031910 A1 Mar. 14, 2002

Related U.S. Application Data

(63) Continuation of application No. 09/590,722, filed on Jun. 8, 2000, now Pat. No. 6,303,406.

(51) Int. Cl.[7] .............................................. H01L 21/00
(52) U.S. Cl. ............................. 438/72; 438/64; 438/69; 438/70; 438/636
(58) Field of Search .............................. 438/72, 64, 69, 438/70, 636; 73/514.18, 514.24, 514.32

(56) References Cited

U.S. PATENT DOCUMENTS 5,733,713 A * 3/1998 Yano et al. ................. 430/316
5,922,212 A * 7/1999 Kano et al. ................... 216/12
6,171,885 B1 * 1/2001 Fan et al. ...................... 438/70
6,192,757 B1 * 2/2001 Tsang et al. ............... 73/514.32
6,221,686 B1 * 4/2001 Drowley et al. .............. 438/57

* cited by examiner

Primary Examiner—John F. Niebling
Assistant Examiner—Viktor Simkovic
(74) Attorney, Agent, or Firm—Powell Goldstein Frazer & Murphy LLP

(57) ABSTRACT

The present invention is a method for integrating an anti-reflection layer and a salicide block. The method comprises the following steps: A substrate is provided that is divided into at least a sensor area and a transistor area, wherein the sensor area comprises a doped region and the transistor area comprises a transistor that includes a gate, a source and a drain; forming a composite layer on the substrate, wherein the composite layer at least also covers both the sensor area and the transistor area, and the composite layer increases the refractive index of light that propagates from the doped region into the composite layer; performing an etching process and a photolithography process to remove part of the composite layer and to let top of the gate, the source and the drain are not covered by the composite layer; and performing a salicide process to let top of the gate, the source and the drain are covered by a silicate. One main characteristic of the invention is that the composite layer can be used as an anti-reflection layer of the sensor area and a salicide block of the transistor region. The composite layer is made of several basic layers and refractive index of any basic layer is different from refractive indexes of adjacent basic layers.

34 Claims, 9 Drawing Sheets

METHOD FOR INTEGRATING ANTI-REFLECTION LAYER AND SALICIDE BLOCK

This application is a continuation of application Ser. No. 09/590,722, filed Jun. 8, 2000, now U.S. Pat. No. 6,303,406.

BACKGROUND OF THE INVENTION

1. Field of the Invention

The proposed invention relates to a method for integrating an anti-reflection layer and a salicide block, and more particularly to a method for simplifying fabricating process of a photodetector device.

2. Description of the Prior Art

Because of advancement of semiconductor technology and the gradually increased requirement of high-integrated devices, the importance of a device that includes several different functional elements is increased, such as the photodetector device that includes a photodiode and a transistor. However, because any specific functional element corresponds to a specific structure and a specific fabricating process, inconsistent difficulties is unavoidable during integration of different elements, especially when the structure of any element is complex, such as complementary metal-oxide semiconductor. A popular solution of the difficulty is to divide the whole device into several independent parts and then to form each part separately. For instance, a chip is divided into several parts and when any specific part is formed photoresist is used to cover other parts. Obviously, unavoidable disadvantages of this method comprise prolonged cycle time and increased wastage of interactants.

In terms of a photodetector device that is usually used by a digital camera and scanner, as the basic structural illustration shown in FIG. 1A, the photodetector device is formed on substrate 10 and comprises sensor area 11 and transistor area 12. Herein, several isolations 102 are located on substrate 10, some doped regions 101 are located in the sensor area and are separated from each other by some isolations 102, and there are transistors made of gates 121, sources 122, drains 123 and spacers 124 located in the transistor area. And silicide 125 locates on gates 121, sources 122 and drains 123. Besides, dielectric layer 13 locates on substrate 10 and covers all forementioned structures, interconnects 14 locates on dielectric layer 13 and further connects with transistors, covering layer 15 locates on dielectric layer 13 and totally covers interconnects 14, and color filter 16 locates on covering layer 15 and over doped regions 101. Further, because color filter 16 is used to let only some specific light propagate to specific doped regions 101, not only is at least one color filter located over any doped region 101, but also there is no light restrictive structure, such as interconnect 14 located between a doped region 101 and corresponding color filter 16.

However, in sensor area 11, because the light that propagates through color filters 16 to doped regions 101 will be partly reflected and also owing to the fact that light does not always vertically propagate to doped regions 101, reflected light will be distributed in all directions. Significantly, as reflected light is reflected by light restrictive interconnects 14, it is possible that any doped region 101 is interfered with by other doped regions 101 and then crosstalk phenomena occurs. This means that any doped region 101 cannot distinguish between received light as being the light propagated from corresponding color filter 16 or the light propagated from neighboring interconnects 14 which only is noise. Therefore, as FIG. 1B shows, to make sure any doped region 101 is not interfered with by light that is reflected by other doped regions 101, it is necessary to form anti-reflection layer 17 on all doped regions 101 before dielectric layer 13 is formed. As usual, available materials of anti-reflection layer 17 are TiN, Ti or TiW.

On the other hand, in transistor area 12, importance of silicide 125 is increased as critical scale is decreased, but it is not desired to cover total transistor area 12 by silicide 125. That is to say, it is necessary to form salicide block 18 on substrate 10 and cover the forbidden region of transistor area 12 before silicide 125 is formed, as FIG. 1B shows, where the forbidden region is the region in which silicide 125 is not required. In general, material of the salicide block 18 will not react with metal for forming silicide 25, and available materials comprise tetraethyl-orthosilicate (TEOS).

According to the previous discussion, it is natural that because the material of anti-reflection layer 17 is different from the material of salicide block 18, through doped regions 101 and isolations 102 of both areas can be formed together to simplify the fabricating process of the photodetector device, but the following processes of different areas cannot be formed at the same time until silicide 125 is formed. However, and referring to FIG. 1B, due to the structural difference of the two areas, some processes for constructing these different structures are always incompatible, such as the process for forming gate 121, the process for forming silicide 125 and the process for forming color filter 16. But due to the location of the anti-reflection layer as being similar to the location of salicide block 18, it is possible to integrate the process for forming anti-reflection layer 17 and the process for forming salicide block 18. Thus, overcoming current difficulties to properly integrate these processes is an important field of fabrication processes of the photodetector device.

SUMMARY OF THE INVENTION

A principal object of the present invention is to provide a method for integrating the fabricating processes of anti-reflection layer and the fabricating processes of the salicide block.

Another object of the present invention is to provide a method for forming both the anti-reflection layer and the salicide block at the same time.

A further object of the present invention is to provide a method in which the anti-reflection layer and the salicide block are made of identical materials.

Still an object of the invention is to provide a manufacturable and practical method for forming both the anti-reflection layer and the salicide block.

Objects of the invention further includes a method for forming a photodetector device, where anti-reflection layer for preventing crosstalk phenomena and a salicide block for making sure the location of silicide are formed together to simplify the fabricating process and to improve efficiency.

In short, a preferred embodiment of the present invention is a method which comprises: Providing a substrate that is divided into at least a sensor area and a transistor area, wherein the sensor area comprises a doped region and the transistor area comprises a transistor that includes a gate, a source and a drain; forming a composite layer on the substrate, wherein the composite layer at least also covers both the sensor area and the transistor area, and the composite layer increases the refractive index of light that propagates from the doped region into the composite layer; performing an etching process and a photolithography process to remove part of the composite layer and to let top of the gate, the source and the drain not being covered by the composite layer; and performing a salicide process to let top of the gate, the source and the drain being covered by a silicate.

Further, when the embodiment is applied to form a photodetector device, the following steps are included: Removing some leftover interacts of the salicide process; forming a first dielectric layer on both the composite layer and the silicide layer; forming some interconnects on the first dielectric layer, wherein interconnects locate over both transistors and isolations; forming a second dielectric layer on the first dielectric layer, wherein the second dielectric layer also covers the interconnects; and forming some color filters on the second dielectric layer, wherein the color filters locate over these doped regions.

Obviously, one main characteristic of the invention is that the composite layer is used as an anti-reflection layer of the sensor area and a salicide block of the transistor region at the same time. Thus, after doped regions and transistors are all formed, it is possible to integrate the fabricating processes of the anti-reflection layer and the fabricating processes of the salicide block. Further, the composite layer is made of several alternate overlapped basic layers and the refractive index of any basic layer is different from refractive indexes of adjacent basic layers.

BRIEF DESCRIPTION OF THE DRAWINGS

In the accompanying drawing forming a material part of this description, there is shown.

DESCRIPTION OF THE PREFERRED EMBODIMENT

First of all, according to the present invention, the function of the salicide block is to prevent metal for forming silicide from adhering to forbidden regions of the substrate where silicide is unexpected, and then the dielectric is an available material of the salicide block. In contrast, the function of the anti-reflection layer is to minimize refractive intensity of light that propagates to the substrate, then the available condition of materials of the anti-reflection layer should be focused on the refractive ratio of light that propagates from the substrate into anti-reflection layer.

Next, the following clue about an unsolved issued is disclosed: Because the conventional material of the salicide block is dielectric which is a photic material with a refractive index, and also because one basic optical principle that total reflection occur when light is propagated from low refractive index material into high refractive index material, it is reasonable that whenever a composite layer is made of several multifold different dielectric layers, the composite layer can totally reflect light that propagates in specific directions. In other words, the composite layer can be used as an anti-reflection layer, even though each dielectric layer is photic.

Accordingly, the inventor points out that forming a composite layer by several multifold dielectric layers is a possible method of forming a layer with the function of total reflection, and then the same materials, dielectric, can be used to form both a salicide block and an anti-reflection layer at the same time. Thus, the method of the present invention is an effective method of integrating the fabricating processes of the anti-reflection layer and the fabricating processes of the salicide block.

The following preferred embodiment of the present invention is a method for integrating the salicide block and the anti-reflection layer.

Figure 2A:
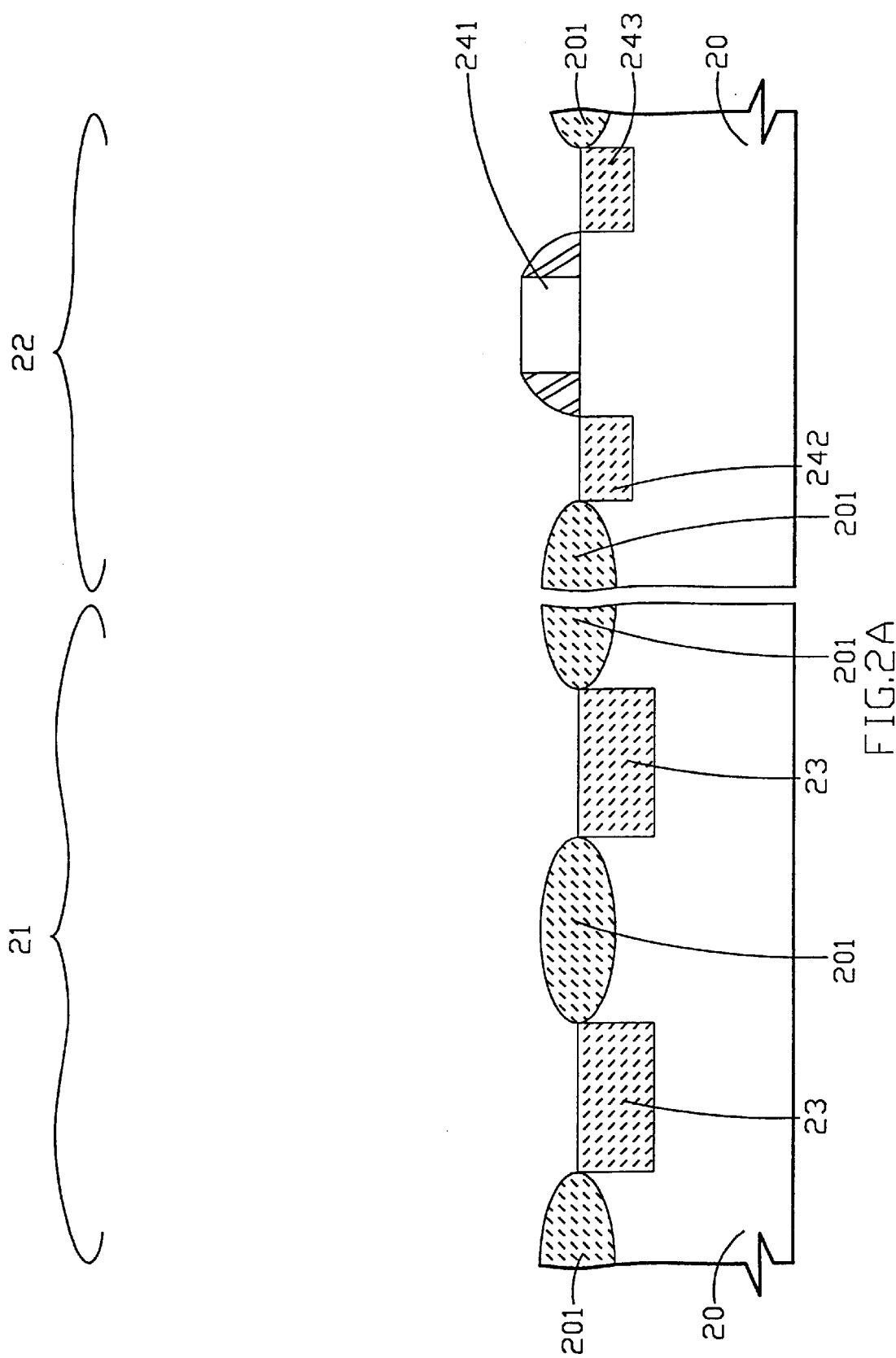
FIG. 2A to FIG. 2G are a series of qualitative cross-section illustrations of essential steps of one preferred embodiment of the invention.

As FIG. 2A shows, a substrate 20 is provided that can be divided into at least sensor area 21 and transistor area 22, where sensor area 21 comprises doped regions 23 and transistor area 22 comprises transistors that include gates 214, sources 242, drains 243 and spacers 244. Moreover, sensor area 21 and transistor areas 22 are separated by isolations 201.

Figure 2B:
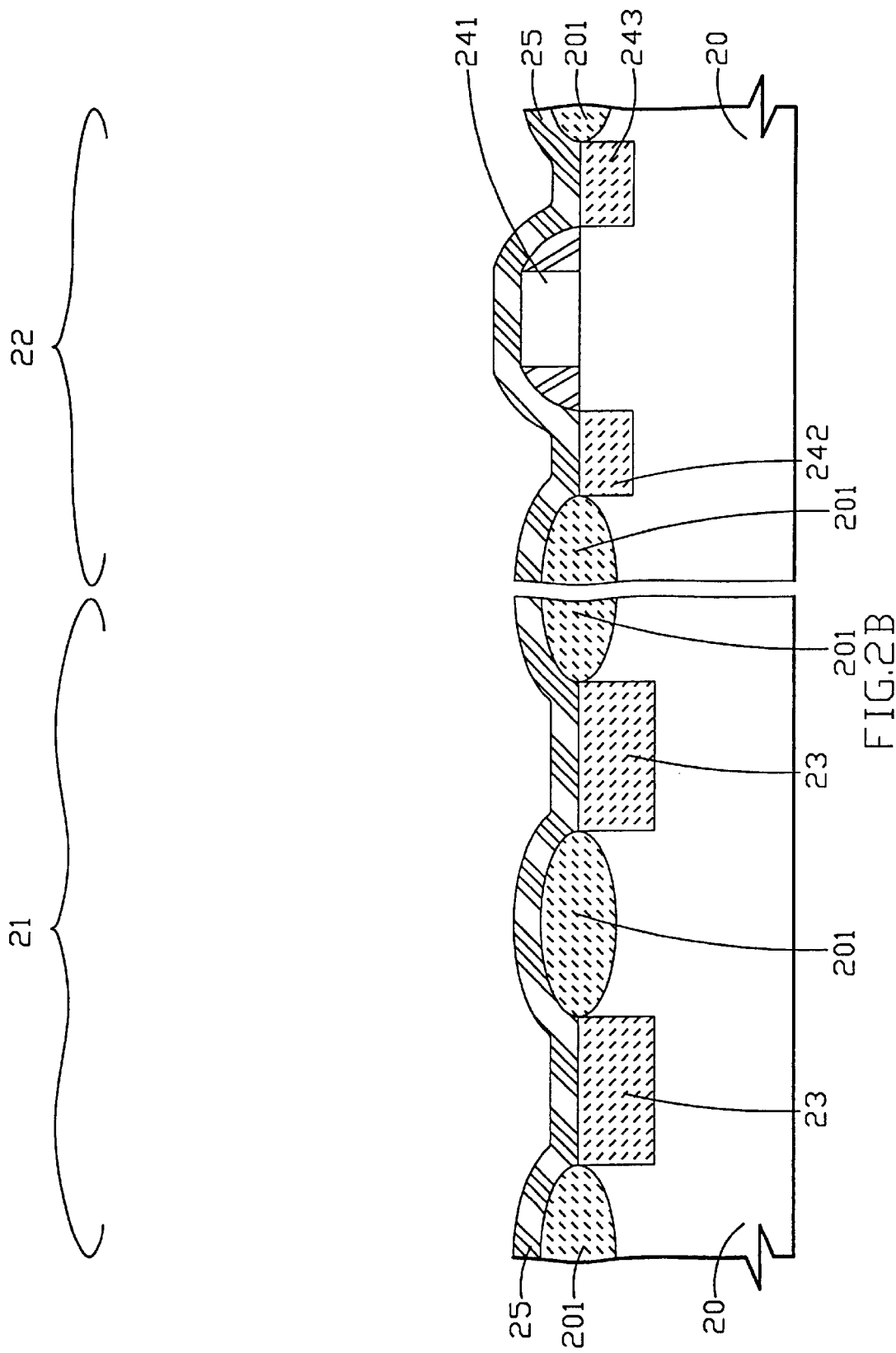

As FIG. 2B shows, composite layer 25 is formed on substrate 20, wherein doped regions 23 and transistors also are covered by a composite layer. Here, composite layer 25 functions to increase the refractive index of light that propagates from doped regions 23 into composite layer 25.

It should be noted that composite layer 25 comprises several basic layers which are alternatingly overlapped, and the refractive index of any specific basic layer is different from the refractive index of adjacent basic layers. Because the total reflection will occur when light propagates from high refractive index material into low refractive index material but total reflection will not occur when light propagates from low refractive index material into high refractive index material, it is possible to totally reflect light that propagates from doped regions 23 into composite layer 25, at least substantially increasing the reflective ratio, by properly adjusting relative factors, such as refractive index and thickness, of these basic layers. In this way, even though materials of composite layer 25 are photic but composite layer 25 also can be used as an anti-reflection layer. Certainly, refractive index and thickness of all basic layers should be adjusted according to practical configuration, but a general rule is that the refractive index of any specific basic layer is proportional to the distance between doped regions 23 and the specific basic layer.

In general, available materials of composite layer 25 comprise plasma enhanced tetraethyl-orthosilicate, plasma enhanced silicon nitride and other photic dielectric. Further, to match the requirements of the salicide block of transistor region 22, composite layer 25 usually is made of several plasma enhanced tetraethyl-orthosilicate layers and several plasma enhanced silicon nitride layers, and plasma enhanced tetraethyl-orthosilicate layers and plasma enhanced silicon nitride layers are alternatingly overlapped. Plasma enhanced tetraethyl-orthosilicate layers are formed by a plasma enhanced chemical deposition process and plasma enhanced silicon nitride layers also are formed by a plasma enhanced chemical deposition process. Besides, the thickness of the composite layer is about 500 angstroms.

Figure 2C:
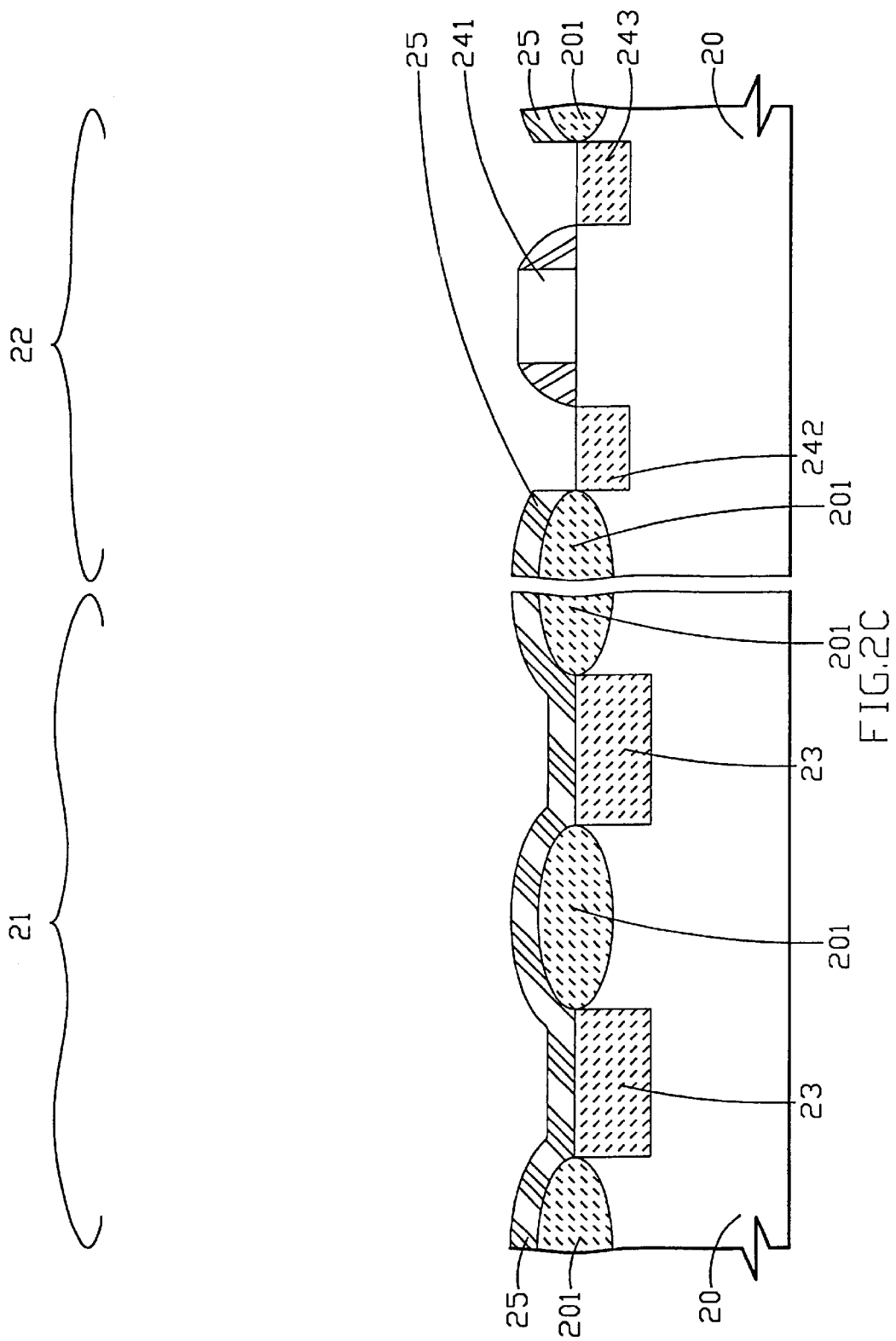

As FIG. 2C shows, a photolithography process is performed and an etching process is performed to remove part of composite layer 25 and to let tops of gates 241, sources 243 and drains 243 not be covered by composite layer 25. Herein, the material of tops of gates 241 is polysilicon.

Figure 2D:
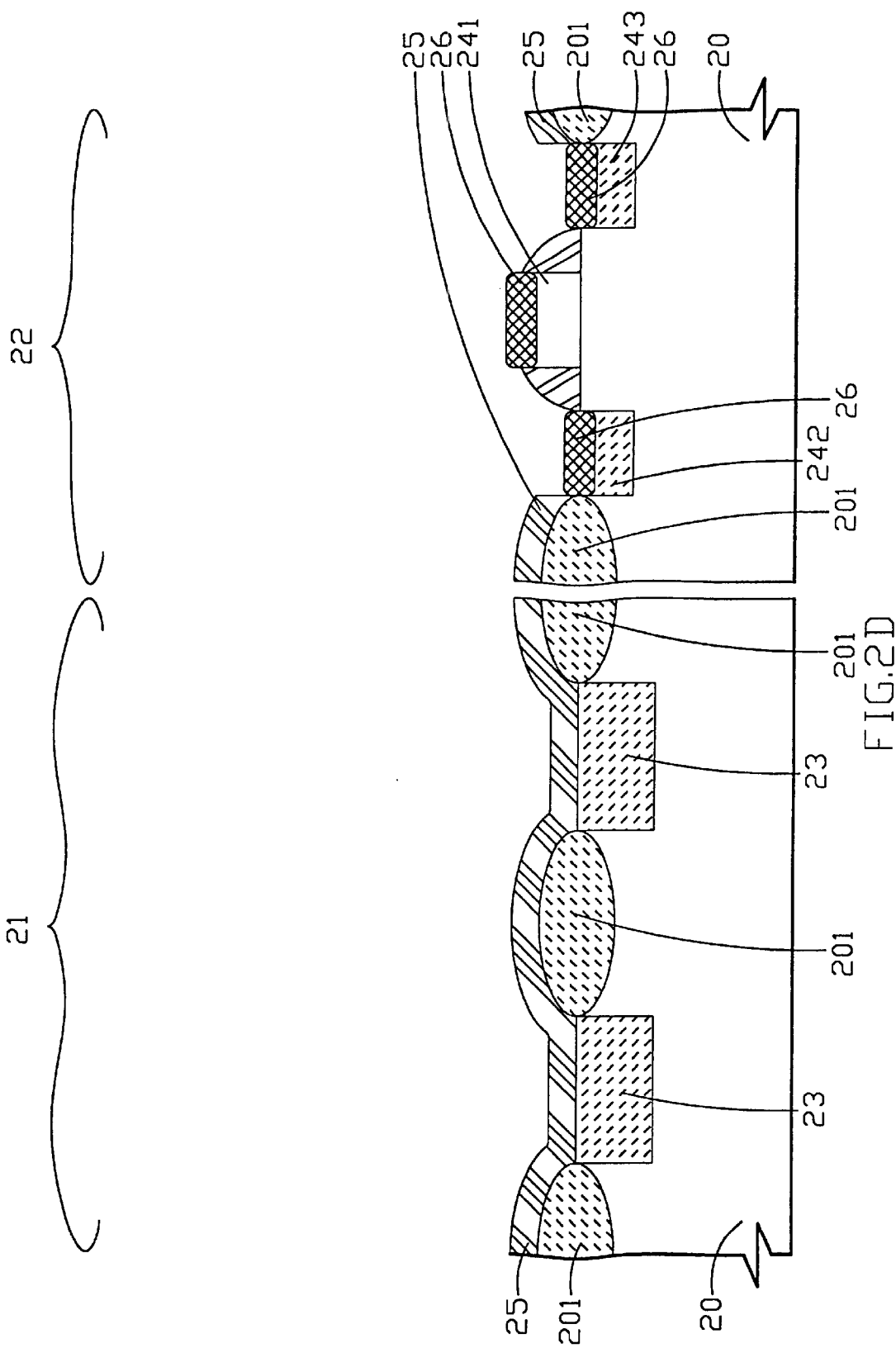

As FIG. 2D shows, a salicide process is performed to form silicide 26 on tops of gates 241, sources 242 and drains 243. It should be noted that the material of composite layer 25 is equal to the conventional material of the salicide block, the then no harmful side effect will be occur when composite layer 25 is used as a salicide block.

Significantly, according to the previous discussion, composite layer 25 acts as a salicide block when silicide 26 is formed in transistor area 22; composite also acts as an anti-reflection layer in sensor area 21. Therefore, the present invention is a method that properly integrates the fabricating processes of anti-reflection layer and the fabricating processes of the salicide block. Besides, because the fabricating processes of composite layer 25 only include processes for forming some dielectric layers, the invention also is a manufacturable and practical method.

Figure 2E:
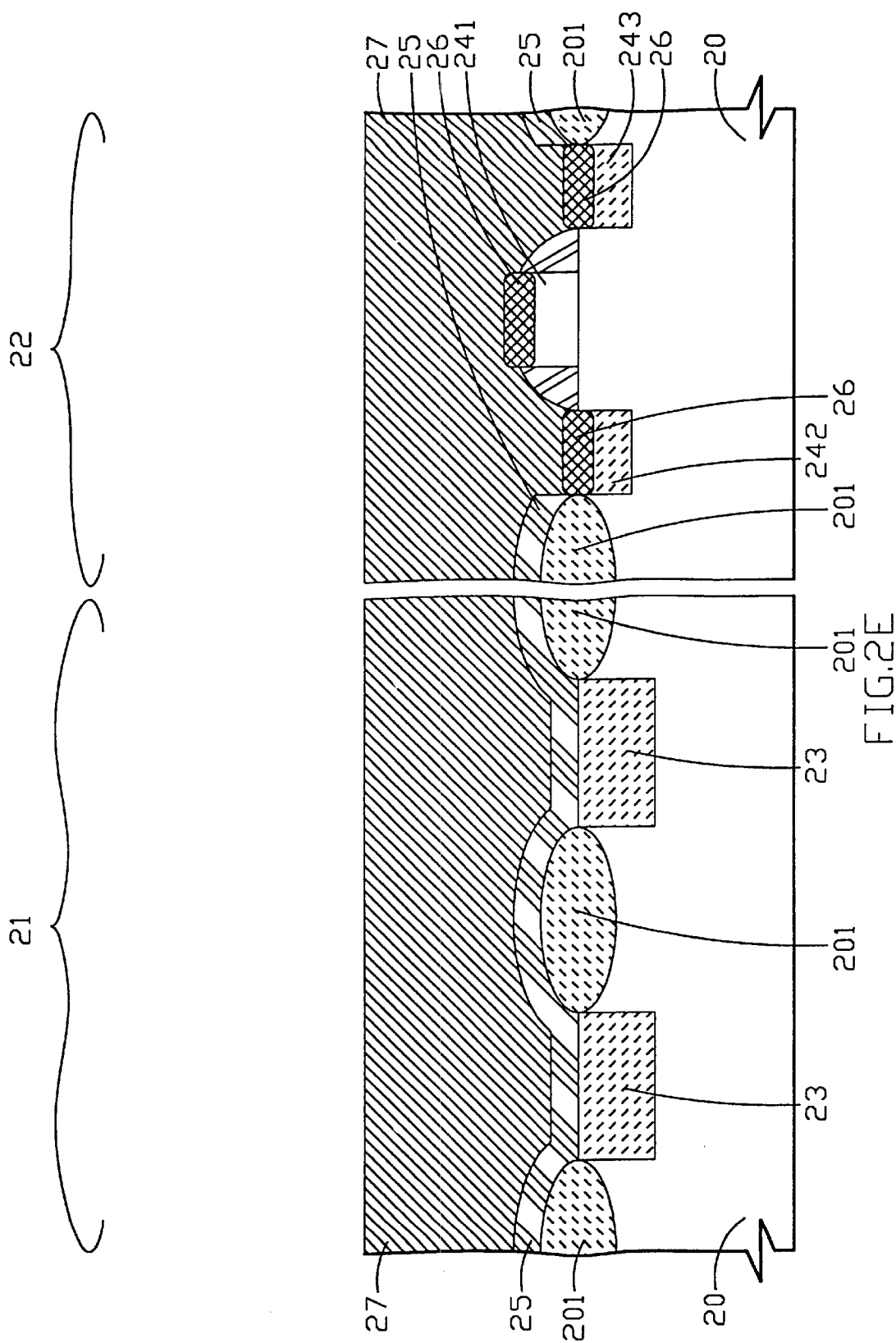
Figure 2F:
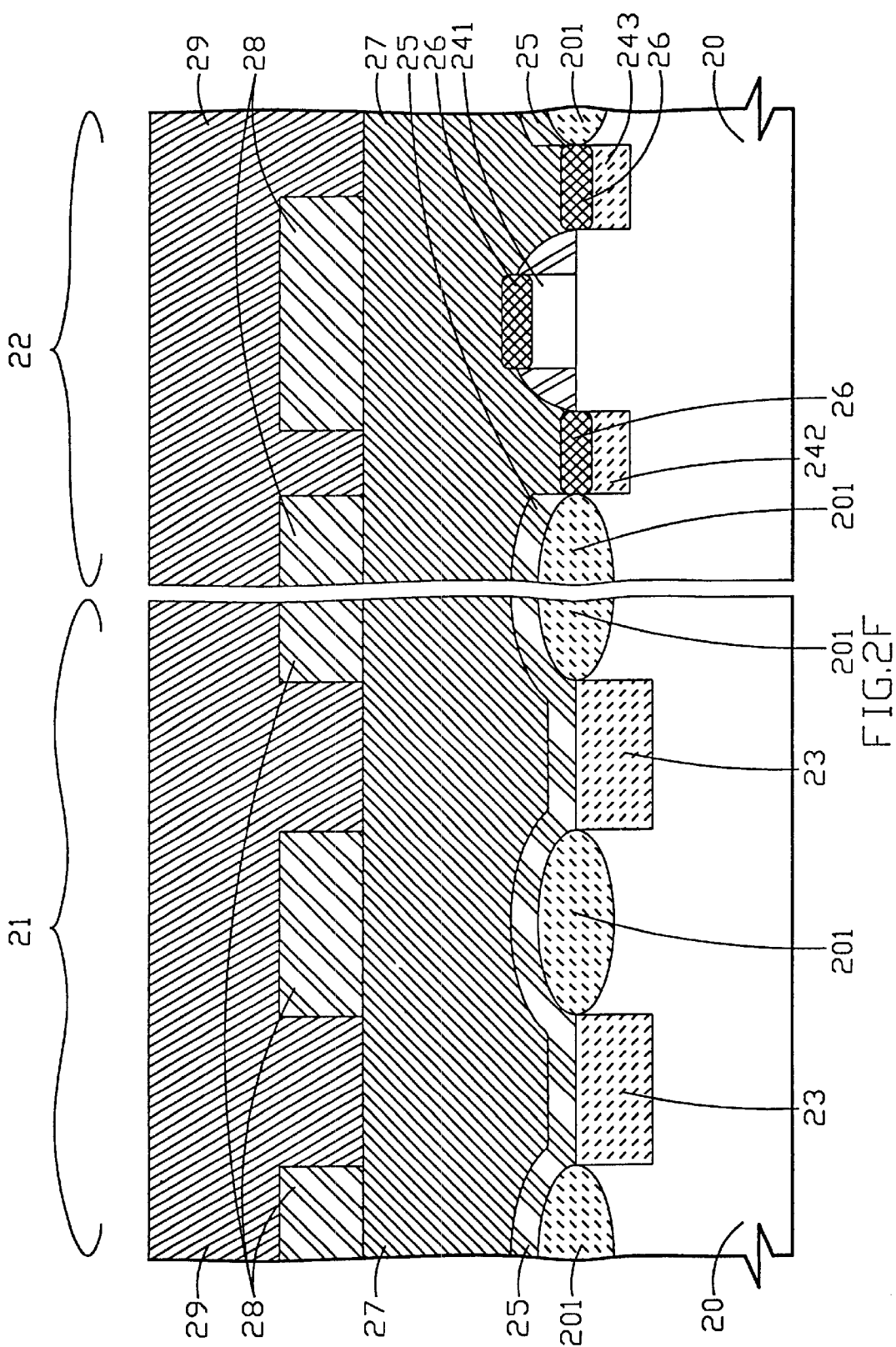
Figure 2G:
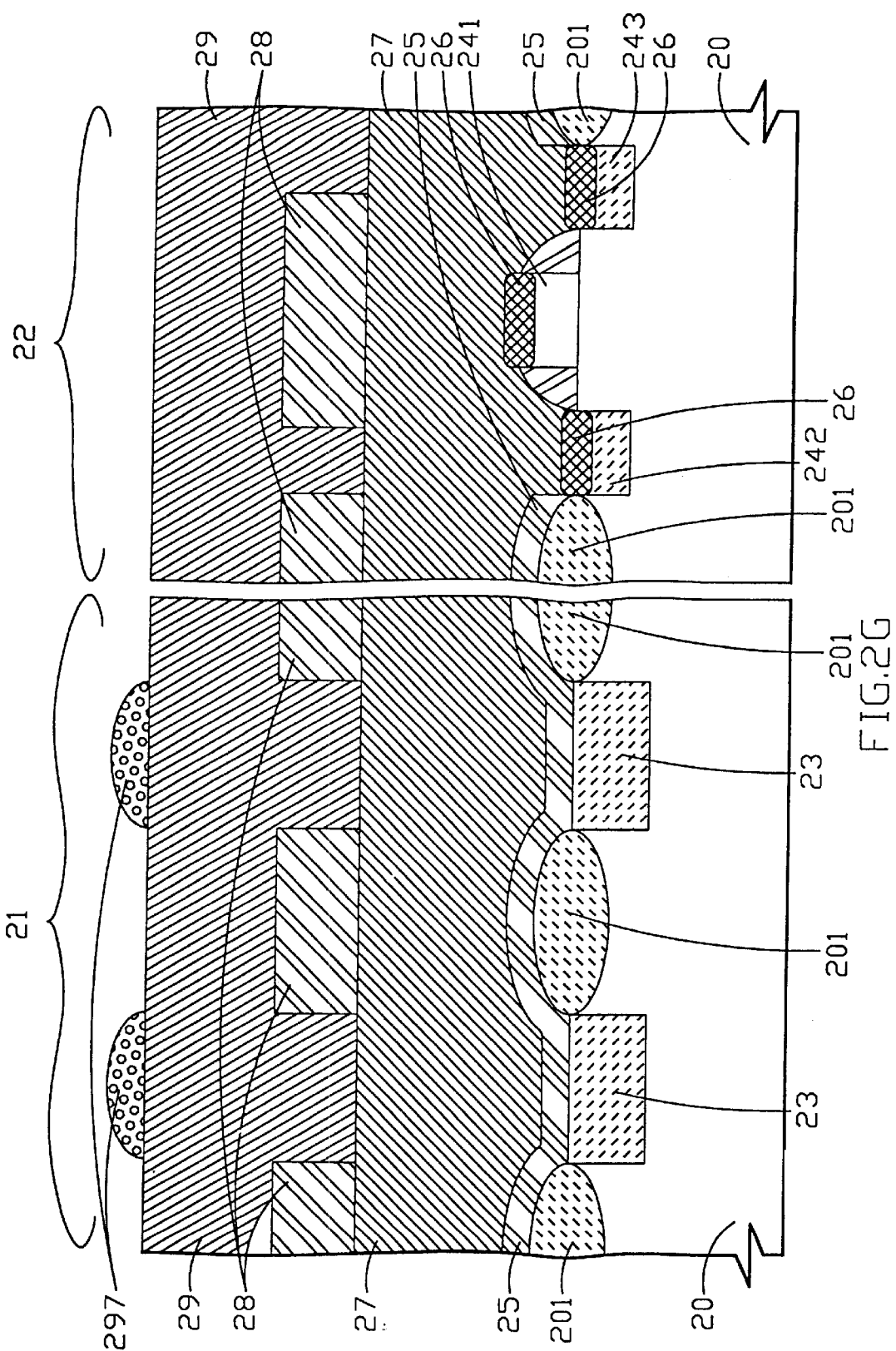

Further, when the embodiment is applied to practice case that forms a photodetector device, as shown in FIG. 2E to FIG. 2G, the following steps are included:

As FIG. 2E shows, some leftover interfacts of the salicide process are removed and then first dielectric layer 27 is formed on both composite layer 25 and silicide layer 26.

As FIG. 2F shows, some interconnects 28 are formed on first dielectric layer 27 and then second dielectric layer 29 is formed on first dielectric layer 27. Wherein interconnects 27 locate over both transistors and isolations 201 and second dielectric layer 29 also covers interconnects 28. Further, interconnects 28 usually are connected with transistors and also usually are coupled with doped regions 23.

As FIG. 2G shows, and some color filters 295 are formed on second dielectric layer 29, wherein color filters 295 locate over doped regions 23. Available varieties of the color filters comprise red light color filter, blue light color filter and green light color filter. And as usual, at least one color filter 295 locates over one said doped region 23.

Incidentally, owing to the increased complexity of current semiconductor devices, substrate 20 further comprises numerous resistors (not shown in the figures) that are covered by composite layer 25. In general, these resistors usually are some polysilicon structures on 21 isolations, and these polysilicon structures and tops of gates 241 of transistors are formed at the same time. Beside, these resistors usually are coupled with transistors.

Figure 1A:
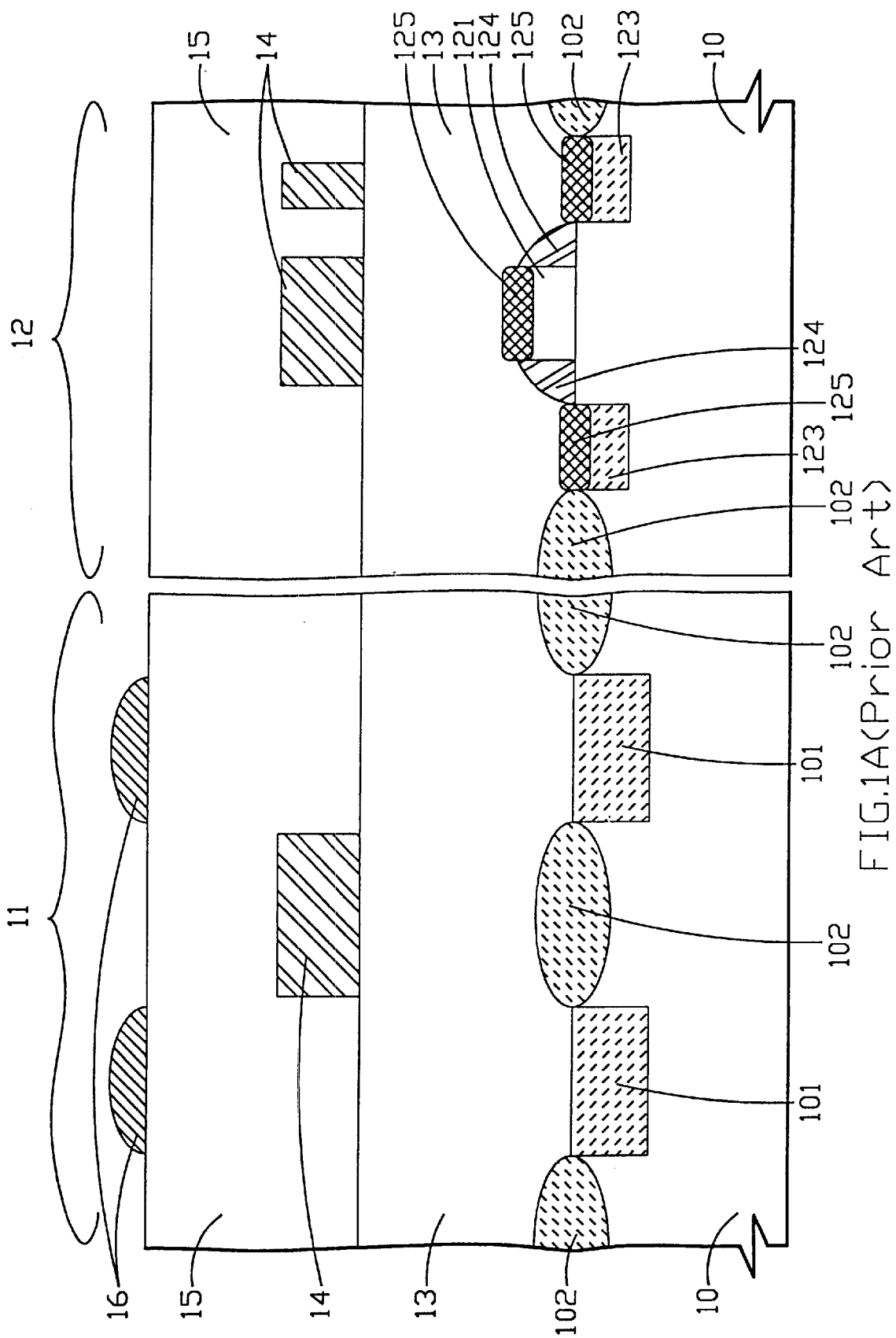
FIG. 1A and FIG. 1B are brief illustrations for explaining the location and function of both the anti-reflection layer and the salicide block.
Figure 1B:
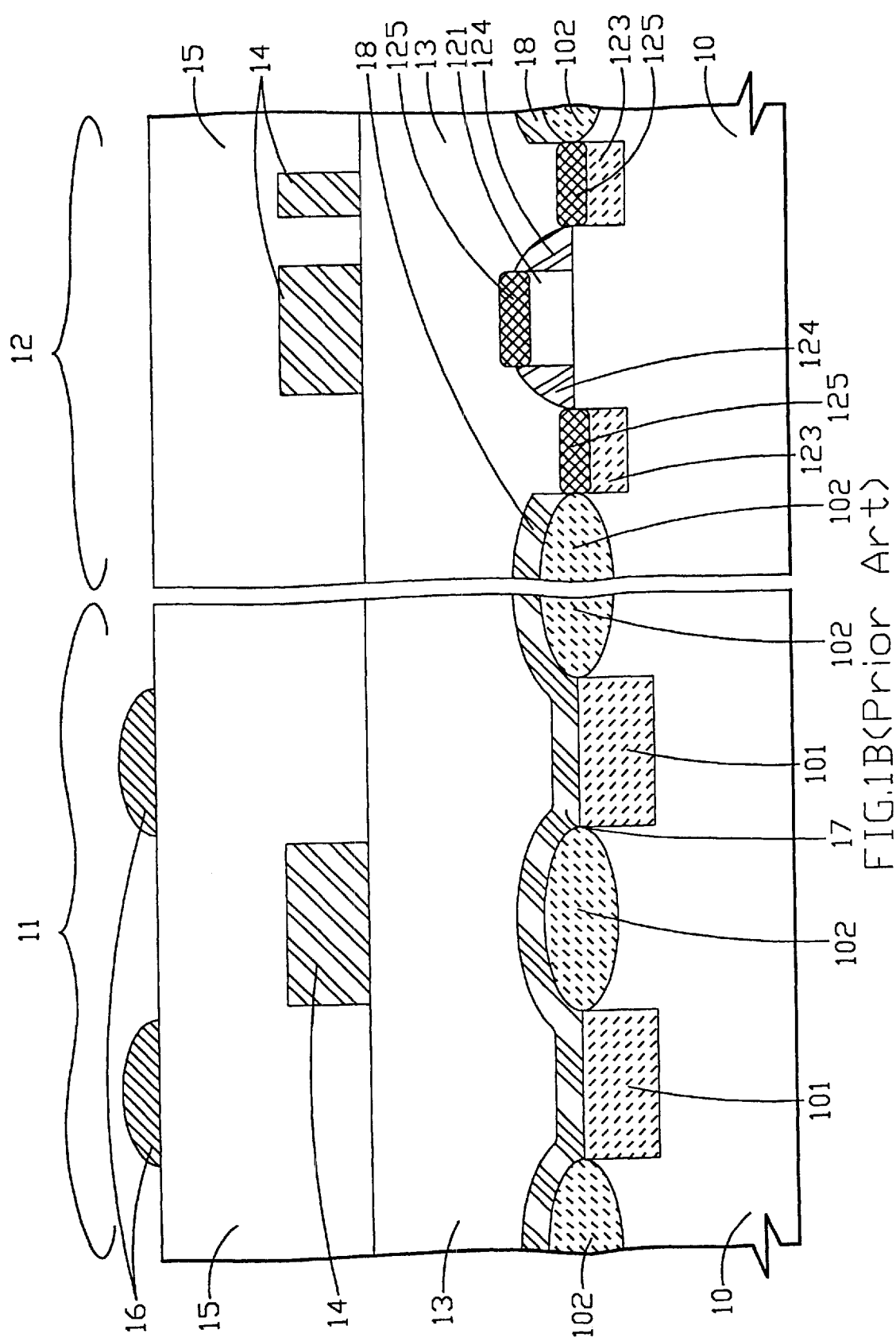

By comparing FIG. 2G and FIG. 1B, it is clear that composite layer 25 efficiently behaves as an anti-reflection layer, and then interconnects 28 almost cannot let any specific doped region 23 receive light that is propagated from other doped regions 23. In other words, the invention can efficiently prevent crosstalk phenomena and thus is a suitable method for forming a photodetector device.

Although a specific embodiment has been illustrated and described, it will be obvious to those skilled in the art that various modifications may be made without departing from what is intended to be limited solely by the appended claims.

What is claimed is:

1. A method for integrating an anti-reflection layer and a salicide block, said method comprising following steps:
   providing a substrate, said substrate being divided into at least a sensor area and a transistor area, wherein said sensor area comprises a doped region and said transistor area comprises a transistor that includes a gate, a source and a drain;
   forming a composite layer on said substrate, wherein said composite layer covers both said sensor area and said transistor area, wherein said composite layer prevents an incident light from scattering out;
   removing part of said composite layer to expose top of said gate, said source and said drain; and
   performing a salicide process such that top of said gate, said source and said drain are covered with silicate.

2. The method according to claim 1, wherein said sensor area and said transistor area is separated by an isolation.

3. The method according to claim 1, wherein material of top of said transistor is polysilicon.

4. The method according to claim 1, wherein said composite layer comprises several basic layers which are alternately overlapped.

5. The method according to claim 4, wherein refractive index of each said basic layer is different from refractive index of the adjacent basic layers.

6. The method according to claim 4, wherein the refractive index of each said basic layer is smaller than the refractive index of the basic layer directly underneath it.

7. The method according to claim 1, wherein available materials of said composite layer comprise plasma enhanced tetraethyl-orthosilicate and plasma enhanced silicon nitride.

8. The method according to claim 1, wherein said composite layer is made of a plurality of plasma enhanced tetraethyl-orthosilicate layers and a plurality of plasma enhanced silicon nitride layers.

9. The method according to claim 8, wherein said plasma enhanced tetraethyl-orthosilicate layers are formed by a plasma enhanced chemical deposition process.

10. The method according to claim 8, wherein said plasma enhanced silicon nitride layers are formed by a plasma enhanced chemical deposition process.

11. The method according to claim 1, wherein thickness of said composite layer is about 500 angstroms.

12. A method for forming a photodetector device, comprising
    providing a substrate, said substrate being divided into at least a sensor area and a resistor area, wherein said sensor area comprises a doped region and said transistor area comprises a transistor that includes a gate, a source and a drain;
    forming a composite layer on said substrate, wherein said composite layer covers both said sensor area and said transistor area, wherein said composite layer prevents an incident light from scattering out;
    removing part of said composite layer to expose top of said gate, said source and said drain;
    removing part of said composite layer to define a salicide area the comprises a plurality of tops of gates, a plurality of sources and a plurality of drain;
    performing a salicide process to form a silicide layer on said salicide area;
    removing a plurality of leftover interacts of said salicide process;
    forming a first dielectric layer on both said composite layer and said silicide layer;
    forming a plurality of interconnects on said first dielectric layer, wherein said interconnects locate over both said transistors and said isolations;
    forming a second dielectric layer on said first dielectric layer, wherein said second dielectric layer also covers said interconnects; and
    forming a plurality of color filter on said second dielectric layer, said color filters locating over said doped regions.

13. The method according to claim 12, wherein said substrate further comprises a plurality of resistors.

14. The method according to claim 13, wherein said resistors are a plurality of polysilicon structures on said isolations.

15. The method according to claim 14, wherein said polysilicon structures and tops of gates of said transistors are formed at the same time.

16. The method according to claim 12, wherein said resistors are coupled with said transistors.

17. The method according claim 12, wherein said composite layer covers said resistors.

18. The method according to claim 12, wherein said composite layer comprises several basic layers.

19. The method according to claim 18, wherein refractive index of any specific said basic layer is different from refractive index of adjacent basic layers.

20. The method according to claim 18, wherein the refractive index of each said basic layer is smaller than the refractive index of the basic layer directly underneath it.

21. The method according to claim 12, wherein said available materials of said composite layer comprise plasma enhanced tetraethylorthosilicate and plasma enhanced silicon nitride.

22. The method according to claim 12, wherein said composite layer is made of both a plurality of plasma enhanced tetraethyl-orthosilicate layers and a plurality of plasma enhanced silicon nitride layers.

23. The method according to claim 22, wherein said plasma enhanced tetraethyl-orthosilicate layers are formed by a plasma enhanced chemical deposition process.

24. The method according to claim 22, wherein said plasma enhanced silicon nitride layers are formed by a plasma enhanced chemical deposition process.

25. The method according to claim 12, wherein thickness of said composite layer is about 500 angstroms.

26. The method according to claim 12, wherein said interconnects connects with said transistors.

27. The method according to claim 12, wherein said interconnects are coupled with said doped regions.

28. The method according to claim 12, wherein available varieties of said color filters comprise red light color filters, blue light color filter and green light color filter.

29. The method according to claim 12, wherein at least one said color filters locates over any one of said doped regions.

30. The method according to claim 1, wherein the light propagating from said substrate to said composite layer is totally reflected by said composite layer.

31. The method according to claim 12, wherein the light propagating from said substrate to said composite layer is totally reflected by said composite layer.

32. The method according to claim 12, wherein none of said color filters is affected by the light propagating from said substrate through said composite layer.

33. A method for integrating an anti-reflection layer and a salicide block, comprising:
providing a substrate, said substrate being divided into at least a sensor area and a transistor area, wherein said sensor area comprises a doped region and said transistor area comprises a transistor that includes a gate, a source and a drain;
forming a layer on said substrate, wherein said layer covers both said sensor area and said transistor area, wherein said layer prevents an incident light from scattering out;
removing part of said layer to expose top of said gate, said source and said drain; and
performing a salicide process such that top of said gate, said source and said drain are covered with silicate.

34. The method according to claim 33, wherein the light propagating from said substrate to said layer is totally reflected by said layer.

* * * * *